US008009217B2

(12) United States Patent
Miyagawa

(10) Patent No.: US 8,009,217 B2
(45) Date of Patent: Aug. 30, 2011

(54) SOLID-STATE IMAGING DEVICE
(75) Inventor: Ryohei Miyagawa, Kyoto (JP)
(73) Assignee: Panasonic Corporation, Osaka (JP)
( * ) Notice: Subject to any disclaimer, the term of this patent is extended or adjusted under 35 U.S.C. 154(b) by 363 days.
(21) Appl. No.: 12/427,952
(22) Filed: Apr. 22, 2009
(65) Prior Publication Data
US 2009/0290058 A1 Nov. 26, 2009
(30) Foreign Application Priority Data May 20, 2008 (JP) ................................ 2008-131924

(51) Int. Cl.
H04N 5/335 (2006.01)
H01L 31/113 (2006.01)
(52) U.S. Cl. ....................................... 348/308; 257/290
(58) Field of Classification Search .................. 348/308, 348/294, 300, 301, 302; 257/290, 291; 250/208.1
See application file for complete search history.

(56) References Cited

U.S. PATENT DOCUMENTS
6,674,470 B1 * 1/2004 Tanaka et al. ................. 348/302

| 2006/0202242 | A1 | 9/2006 | Takagi et al. |
| 2007/0020796 | A1 | 1/2007 | Park |
| 2007/0120159 | A1 | 5/2007 | Lee |

FOREIGN PATENT DOCUMENTS
| JP | 2006-253316 | 9/2006 |
| JP | 2008-124229 | 5/2008 |
| JP | 2008-124395 | 5/2008 |

* cited by examiner

Primary Examiner — Hung Dang
(74) Attorney, Agent, or Firm — McDermott Will & Emery LLP

(57) ABSTRACT

In a solid-state imaging device, provided is a solid-state imaging device in which a first gate insulation film 22 for the readout transistor 12 in a pixel is formed so as to be thicker than a second gate insulation film 23 for an amplification transistor 14 in the pixel, and the second gate insulation film 23 for the amplification transistor 14 in the pixel is formed so as to be thicker than a third gate insulation film 24 for an n-type micro transistor 17 and a p-type micro transistor 18 in a peripheral region outside the pixel, whereby it is possible to suppress a 1/f noise of the amplification transistor 14 and also possible to increase a saturated charge amount.

6 Claims, 8 Drawing Sheets

SOLID-STATE IMAGING DEVICE

BACKGROUND OF THE INVENTION

1. Field of the Invention

The present invention relates to a solid-state imaging device, and more particularly relates to a MOS type solid-state imaging device having an amplification transistor included in a pixel.

2. Description of the Background Art

In recent years, a MOS (Metal-Oxide-Semiconductor) type solid-state imaging device used as image information capturing means such as a mobile phone, a digital still camera, a movie camera, and the like is required to realize high resolution, low power consumption, and low cost by reducing a pixel pitch while maintaining high image quality. Along with micronization of pixels, the number of pixels of the MOS type solid-state imaging device is increased, and accordingly, the MOS type solid-state imaging device is expected to read a large amount of pixel information at a high speed and to process images at a high speed.

To realize the requirements and expectations, an improved MOS type solid-state imaging device is increasingly expected which includes, in addition to a pixel region having pixels arranged therein, a high-speed analog-digital (AD) conversion circuit and a DSP (Digital Signal Processor) circuit for processing an image signal obtained through the AD conversion. Therefore, large size circuit blocks need to be arranged outside the pixel region.

Further, due to the micronization of the pixels, an amount of light incident on each pixel is decreased in proportional to an area of the pixel. Consequently, sensitivity per pixel is decreased, and a ratio of a signal level to a noise level, i.e., an S/N ratio, deteriorates. In order to improve the S/N ratio, the noise level needs to be decreased. Among noises generated in a pixel, a 1/f noise generated in an amplification transistor needs to be solved, and it is necessary, along with the micronization of the pixels, to reduce the 1/f noise of the amplification transistor.

Further, due to the micronization of the pixels, an area of a photodiode in a unit pixel is decreased, which leads to a decrease in a maximum charge available from each pixel. Thus, density of an n-type diffusion layer of a photodiode is increased. However, when the density is increased, a potential of the photodiode is raised, which consequently causes a failure in readout of a signal charge accumulated in the photodiode, and thus generates an afterimage. To prevent the afterimage, the density of the n-type diffusion layer of the photodiode is increased, and a voltage to be applied to a readout gate is boosted.

FIG. 1 is a layout configuration of a common MOS type solid-state imaging device. A pixel region 8 is composed of pixels arranged in two-dimensional array, and the pixels in the pixel region 8 are driven by a vertical scanning circuit 1 and a horizontal scanning circuit 3. In the pixel region 8, a signal charge accumulated through photoelectric conversion is amplified by an amplification transistor in each pixel, and is read out to a column circuit 2 as a pixel signal. The column circuit 2 has a noise cancellation function of reducing pixel signal fluctuation which is caused by variation in a threshold value of the pixel amplification transistor, and also has an analog memory function of maintaining a noise-cancelled signal. An analog signal maintained in the column circuit 2 is scanned by the horizontal scanning circuit 3, and then sent to an output amplifier circuit 5. The output amplifier circuit 5 amplifies the analog signal and outputs the amplified output signal from a sensor. A timing pulse for controlling the vertical scanning circuit 1, the column circuit 2, the horizontal scanning circuit 3, and the output amplifier circuit 5 is generated by a timing generation circuit 4. An I/O circuit 7 has a buffer function of inputting a pulse signal for controlling the sensor as a whole, and an output buffer function of outputting a signal or the like so as to supply a sample timing of an output signal to an AFE device or the like which receives the output signal from the solid-state imaging device.

FIG. 2 is a diagram showing, in detail, a circuit configuration including the pixel region 8, the column circuit 2, and the horizontal scanning circuit 3 shown in FIG. 1. FIG. 3 is a diagram showing timing waveforms to illustrate driving of the pixels shown in FIG. 2. With respect to all pixels included in a certain row, when potentials of a readout control line 110 and a reset control line 120 are both set to "H" during a reset period shown in FIG. 3, the photodiode 11 and the floating diffusion 16 are reset. After a completion of an accumulation time, a signal charge is read out. During the readout period, the potential of a row selection signal line is set to "H". During a first half of the readout period, the potential of the reset control line 120 is set to "H", the potential of the floating diffusion 16 is reset, and the potential of the reset control line 120 is set to "L".

A reset potential of the floating diffusion 16 in this state is amplified by the amplification transistor 14, and sent to the column circuit 2 through the vertical common signal line 270. During the second half of the readout period, the potential of the readout control line 110 is set to "H", and a signal charge of the photodiode 11 is transferred to the floating diffusion 16. Thereafter, the potential of the readout control line 110 returns to "L".

A readout potential of the floating diffusion 16 in this state, where the signal charge is read out, is amplified by the amplification transistor 14, and sent to the column circuit 2 through the vertical common signal line 270. In the column circuit 2, difference between the reset potential signal and the readout potential signal is obtained to remove a noise content generated due to the variation in the threshold value of the amplification transistor 14. Therefore, in the case of a complete dark condition, there is no charge read out into the floating diffusion 16, and consequently, the reset potential and the readout potential of the floating diffusion 16 completely correspond to each other.

When the amplification transistor 14 does not include the noise content, the difference between the reset potential signal and the readout potential signal, which are sent to the column circuit 2, is zero. However, micronization in a MOS type semiconductor process is being progressed, and it is generally known that a 1/f noise is generated from a micronized MOS type transistor. In the amplification transistor 14, due to the 1/f noise, even in the case of a complete dark condition, the reset potential signal and the readout potential signal, which are amplified by the amplification transistor 14 and sent to the column circuit 2, are different from each other by an amount of the 1/f noise. Therefore, even if the difference is removed in the column circuit 2, a noise content still remains, which leads to deterioration in image quality.

As described in Japanese Laid-Open Patent Publication No. 2006-253316, it is known that the 1/f noise of the MOS transistor can be reduced by thinning a gate oxide film. However, when the gate oxide films of all transistors within a pixel is simply thinned, a withstand voltage of each gate oxide film is decreased due to the thinning of the gate oxide film. Therefore, the gate voltage at the readout transistor 12 needs to be lowered at the time of readout, for example. When the gate voltage is lowered at the time of readout, the readout cannot be conducted sufficiently. Consequently, a maximum charge amount (hereinafter referred to as a saturated charge amount) that can be output from the photodiode 11 decreases, and consequently a dynamic range decreases. Otherwise, due to insufficient readout, a noise so called an afterimage is generated, which causes deterioration in image quality.

In order to solve the decrease in the saturated charge amount, the decrease being caused by a decrease in an area of the photodiode due to the micronization of pixels, the gate voltage of the readout transistor 12 is raised to increase the saturated charge amount. That is, the gate oxide film of the transistor in the pixel cannot be simply thinned. Therefore, Japanese Laid-Open Patent Publication No. 2006-253316 discloses a technique of thickening the gate oxide film of the readout transistor 12, and thinning the gate oxide film of the amplification transistor 14 in a pixel.

As above described, in the solid-state imaging device using two thickness types of gate oxide films for transistors in the pixel region 8, the two thickness types of gate oxide films are also used for transistors in a peripheral circuit, conventionally. Specifically, for an analog circuit such as the column circuit 2 and the output amplifier circuit 5, which amplify a pixel signal and perform noise cancellation, a transistor having a thick gate oxide film (having a thickness of 9 nm, and a gate length of 0.4 um or more, for example) is used, and the analog circuit is driven with a power voltage of 3.3V. On the other hand, for a logic circuit such as the timing generation circuit 4, a transistor of a thin gate oxide film (having a thickness of 5 nm, and a gate length of 0.25 µm, for example) is used, and the logic circuit is driven with a power voltage of 2.5V.

In the analog circuit, since amplification of pixel signals and the like is performed, the dynamic range of operation needs to be increased, and thus a high power voltage is required. On the other hand, in the logic circuit, for the sake of lowering power consumption, the power voltage needs to be lowered. However, when the number of pixels in the solid-state imaging device is increased along with the micronization of the pixels, it is necessary to read out more number of pixel signals within a single frame period, which leads to an increase in a readout frequency and an increase in the power consumption.

In order to solve the problem, the gate oxide film of the amplification transistor 14 in a pixel is further thinned. For example, when the gate oxide film having a thickness of 2 to 3 nm is used, a micro transistor made of the same gate oxide film having a short gate length can be used in a peripheral logic circuit outside the pixel region 8, and the peripheral logic circuit can be driven with a power voltage of 1.2 to 1.5V. Accordingly, it is possible to lower the power consumption.

On the other hand, when the power voltage supplied to the amplification transistor 14 is lowered, the dynamic range is decreased, and amplitude of a pixel signal is also decreased. Therefore, it has been difficult to realize lowering of the power consumption in the peripheral circuit while maintaining the dynamic range within a pixel.

As above described, in the conventional solid-state imaging device, in order to solve an increase in the 1/f noise of the amplification transistor in a pixel and a decrease in the saturated charge amount, which are caused by the micronization of pixels, two thickness types of gate oxide films are used in each pixel. That is, a thick gate oxide film is used for the readout transistor, whereas a thin gate oxide film is used for the amplification transistor.

However, if the two thickness types of gate oxide films are simply used for transistors in the peripheral circuit outside the pixel region, the power voltage of the peripheral logic circuit cannot be lowered. Therefore, it is difficult to achieve lowering of the power consumption, and micro transistors cannot be used. Therefore, it is difficult to cause the peripheral logic circuit to operate at a high speed, and a chip size will be increased since the size of the transistors in the peripheral circuit cannot be decreased.

SUMMARY OF THE INVENTION

Therefore, an object of the present invention is to provide a solid-state imaging device that is capable of suppressing a 1/f noise of an amplification transistor, and of increasing the saturated charge amount. Further, another object of the present invention is to provide a solid-state imaging device that lowers power consumption in the peripheral logic circuit, and decreases an area of the peripheral logic circuit.

The present invention is directed to a MOS type solid-state imaging device comprising a pixel region having pixels arranged on a matrix; and a peripheral circuit driving the pixels and obtaining output signals. In order to attain the above objects, the pixel region of the solid-state imaging device of the present invention comprises at least one photodiode; a readout transistor for reading a charge accumulated in the photodiode; a floating diffusion composed of an impurity diffusion layer, for converting the read charge into a voltage; a reset transistor for resetting the converted voltage at the floating diffusion to a predetermined voltage; and an amplification transistor receiving a potential of the floating diffusion as a gate input. Further, a first gate insulation film used for the readout transistor in the pixel is thicker than a second gate insulation film used for the amplification transistor in the pixel, and the second gate insulation film used for the amplification transistor is thicker than a third gate insulation film used for at least one of transistors in the peripheral circuit.

Preferably, either of the first gate insulation film and the second gate insulation film may be used for transistors in an analog circuit in the peripheral circuit. Preferably, the transistors are such transistors that are in a column amplifier section of the analog circuit. Further, either of the first gate insulation film and the second gate insulation film may be used for a MOS capacitor arranged in a column circuit of the analog circuit. Still further, either of the first gate insulation film and the second gate insulation film may be used for a transistor in an I/O circuit in the peripheral circuit. Still further, when, in each pixel, a row selection transistor is arranged so as to be in series with the amplification transistor, the second gate insulation film may be used for each of the amplification transistor and the row selection transistor.

According to the present invention, it is possible to reduce a 1/f noise of the amplification transistor. In addition, it is possible to maintain the saturated charge amount by applying a higher gate voltage at the time of readout by the readout transistor. Further, it is possible to lower the power consumption by driving digital circuits, in particular, outside the pixel region with a lower voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
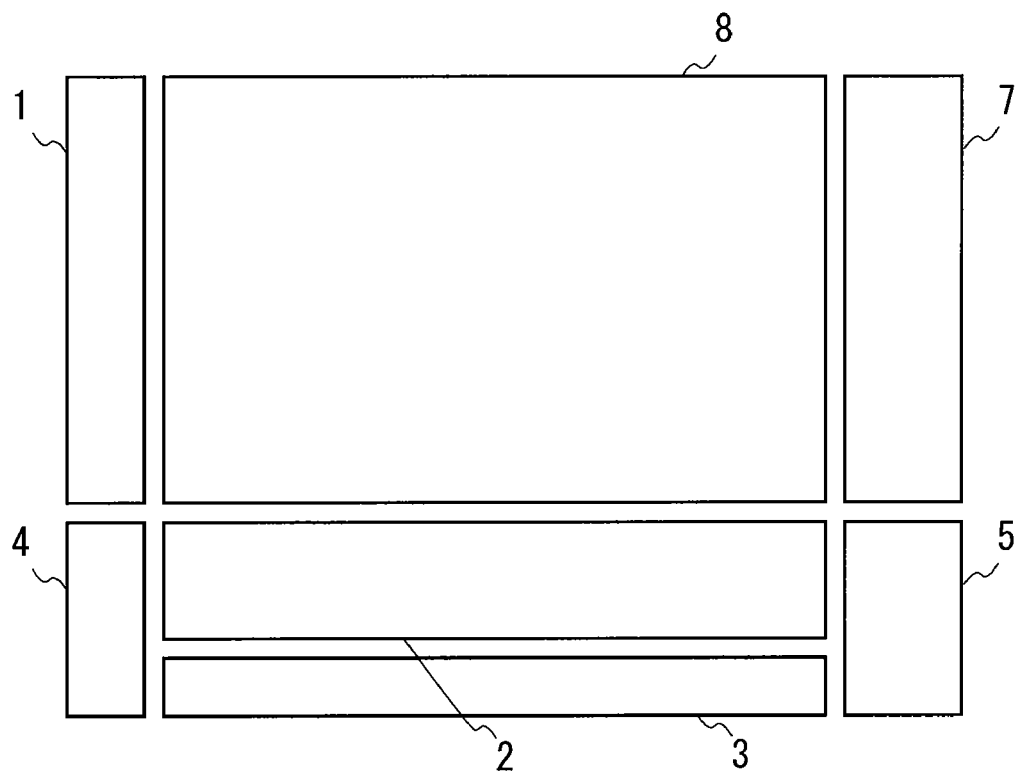
FIG. 1 is a diagram showing a layout configuration that is common to a solid-state imaging device according to a first embodiment of the present invention and a conventional solid-state imaging device.

FIG. 1 is a plan view showing a layout configuration of a solid-state imaging device according to a first embodiment of the present invention. The layout configuration of the solid-state imaging device according to the first embodiment is the same as that of the above-described common solid-state imaging device. Further, a circuit configuration including a pixel region 8, a column circuit 2, and a horizontal scanning circuit 3 is the same as that shown in FIG. 2.

In the first embodiment, a thickness of a gate insulation film is set to 2 to 3 nm, for example, the gate insulation film being used for respective transistors in a timing generation circuit 4, a part of the vertical scanning circuit 1, a horizontal scanning circuit 3, and a part of an I/O circuit 7. A power voltage driving the gate insulation film is 1.2V to 1.8V. A voltage that is the lowest and enhances lowering of power consumption is 1.2V, and if such a voltage is used, then the thickness of the gate insulation film is 2.1 nm. Further, the thickness of the gate insulation film for the amplification transistor 14 in a pixel is set to 4.5 to 7 nm, for example. The thickness of the gate insulation film is set to a lowest possible value that can ensure a withstand voltage in accordance with the power voltage driving the pixel. This is because the thinner the gate insulation film is, the more the 1/f noise of the transistor is suppressed. The thickness of the gate insulation film for the readout transistor 12 in the pixel is set to be 7.5 nm to 9.5 nm, i.e., thicker than that of the amplification transistor 14.

With this configuration, it is possible to apply a higher voltage to the readout transistor 12 than that to the amplification transistor 14, and a larger amount of charge can be transferred to the readout transistor 12 from the photodiode 11. Accordingly, it is possible to increase a saturated charge amount, and also possible to increase the dynamic range.

Figure 4:
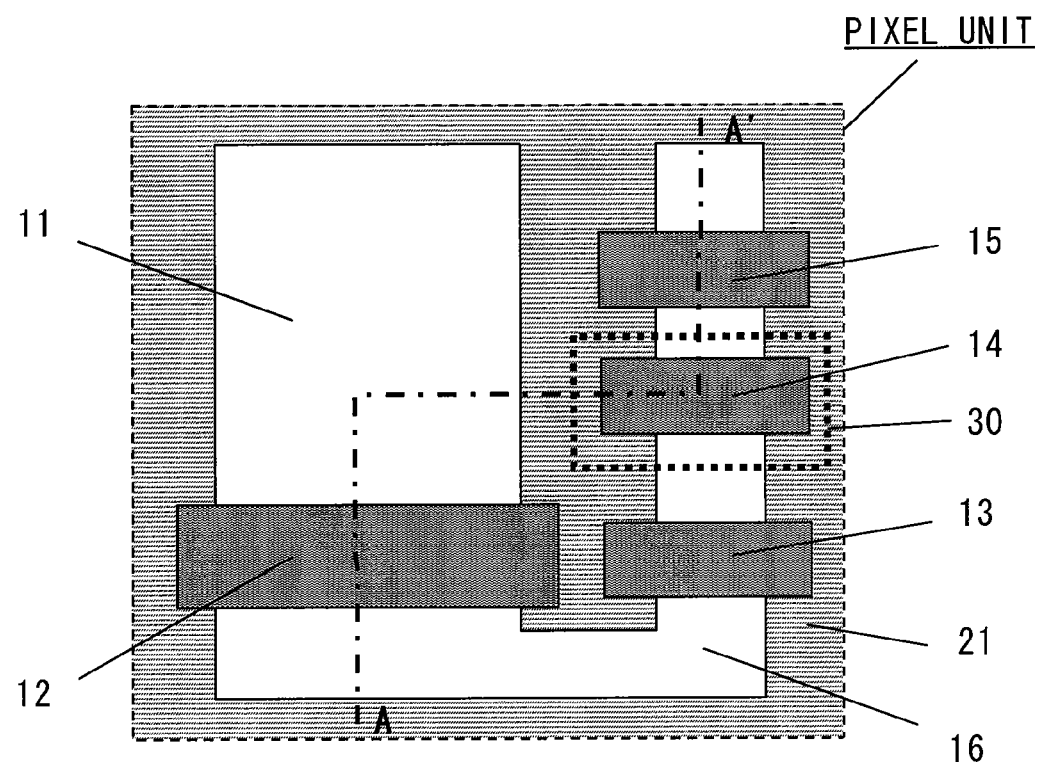
FIG. 4 is a schematic layout of a unit pixel of the solid-state imaging device according to the first embodiment.
Figure 4:
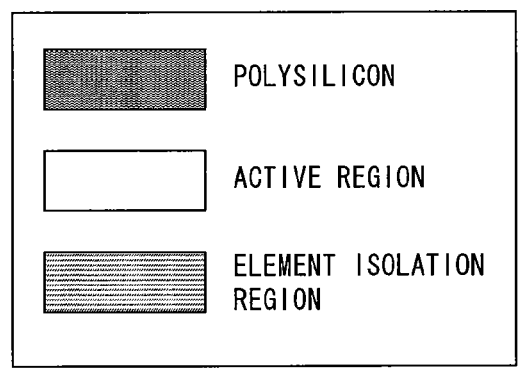
Figure 5:
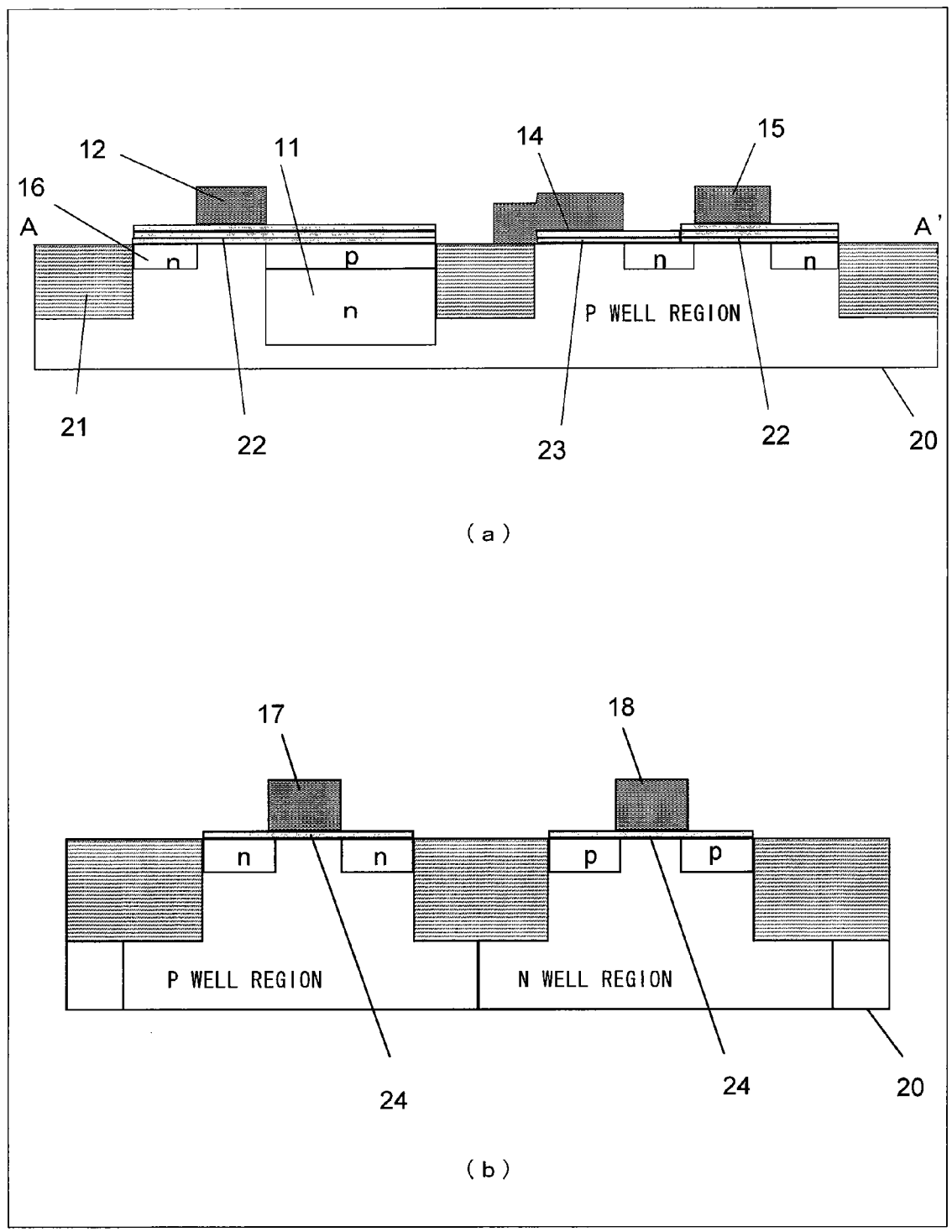
FIG. 5 is a schematic cross-sectional view of the pixel layout shown in FIG. 4.

FIG. 4 is a plan view showing a schematic layout of a unit pixel in the solid-state imaging device according to the first embodiment. FIG. 4 shows an active region, an element isolation region, and a polysilicon gate region. (a) of FIG. 5 is a schematic cross-sectional view of the pixel layout shown in FIG. 4 as cut along A-A' portion. The cross-sectional view shows cross-sections of a floating diffusion 16, the photodiode 11, the readout transistor 12, the amplification transistor 14, and a row selection transistor 15. (b) of FIG. 5 is a schematic cross-sectional view of micro transistors used in the timing generation circuit 4, the vertical scanning circuit 1, the horizontal scanning circuit 3, and the I/O circuit 7. (b) of FIG. 5 shows cross-sections of an n-type micro transistor 17 and a p-type micro transistor 18. Hereinafter, with reference to FIG. 4 and FIG. 5, a structure of the solid-state imaging device according to the first embodiment will be described.

Component elements such as the transistors and the photodiode are formed inside the active region. The active region is defined by an element isolation region 21 of an STI (Shallow Trench Isolation) structure. As shown in (a) of FIG. 5, the unit pixel has a p well region formed within a Si substrate 20, and the photodiode and the transistors are formed in the region. The photodiode 11 is an n-type region, and has a p-type region arranged thereon to reduce a dark current generated on a surface of Si. Each of the transistors has a gate insulation film formed on the active region, i.e., on the surface of the Si substrate 20, and a gate electrode composed of polysilicon is formed on the gate insulation film. With respect to the gate electrode, a source and a drain each composed of an n-type or a p-type diffusion region is formed in a self-aligned manner. Note that the n-type region of the photodiode 11, which corresponds to the source of the readout transistor 12, has two functions. That is, the n-type region functions as the source of the readout transistor 12, and also has a function of collecting photogenerated electrons. Therefore, in most cases, the n-type region is not formed in a self-aligned manner with respect to the gate electrode.

In (b) of FIG. 5, the n-type micro transistor 17 is formed within the p well region, and the p-type micro transistor 18 is formed within an n well region. The structure of each of the n-type micro transistor 17 and the p-type micro transistor 18 is formed such that the gate electrode which is composed of polysilicon is formed on the gate insulation film. A source and a drain composed of an n-type diffusion region and a p-type diffusion region, respectively, are formed in a self-aligned manner with respect to the gate electrode.

As is clear from the cross-sectional view shown in FIG. 5, the feature of the first embodiment is that the gate insulation film for each of the n-type micro transistor 17 and the p-type micro transistor 18 used in the peripheral circuit is thinner than the gate insulation film for each of the transistors 12, 14, and 15 in the pixel. In addition, in the pixel, the gate insulation film for the readout transistor 12 is thicker than the gate insulation film for the amplification transistor 14. That is, the gate insulation film (a first gate insulation film 22) for the readout transistor 12 is thicker than the gate insulation film (a second gate insulation film 23) for the amplification transistor 14, and the second gate insulation film 23 is thicker than the gate insulation film (a third gate insulation film 24) for each of the n-type micro transistor 17 and the p-type micro transistor 18.

Figure 6:
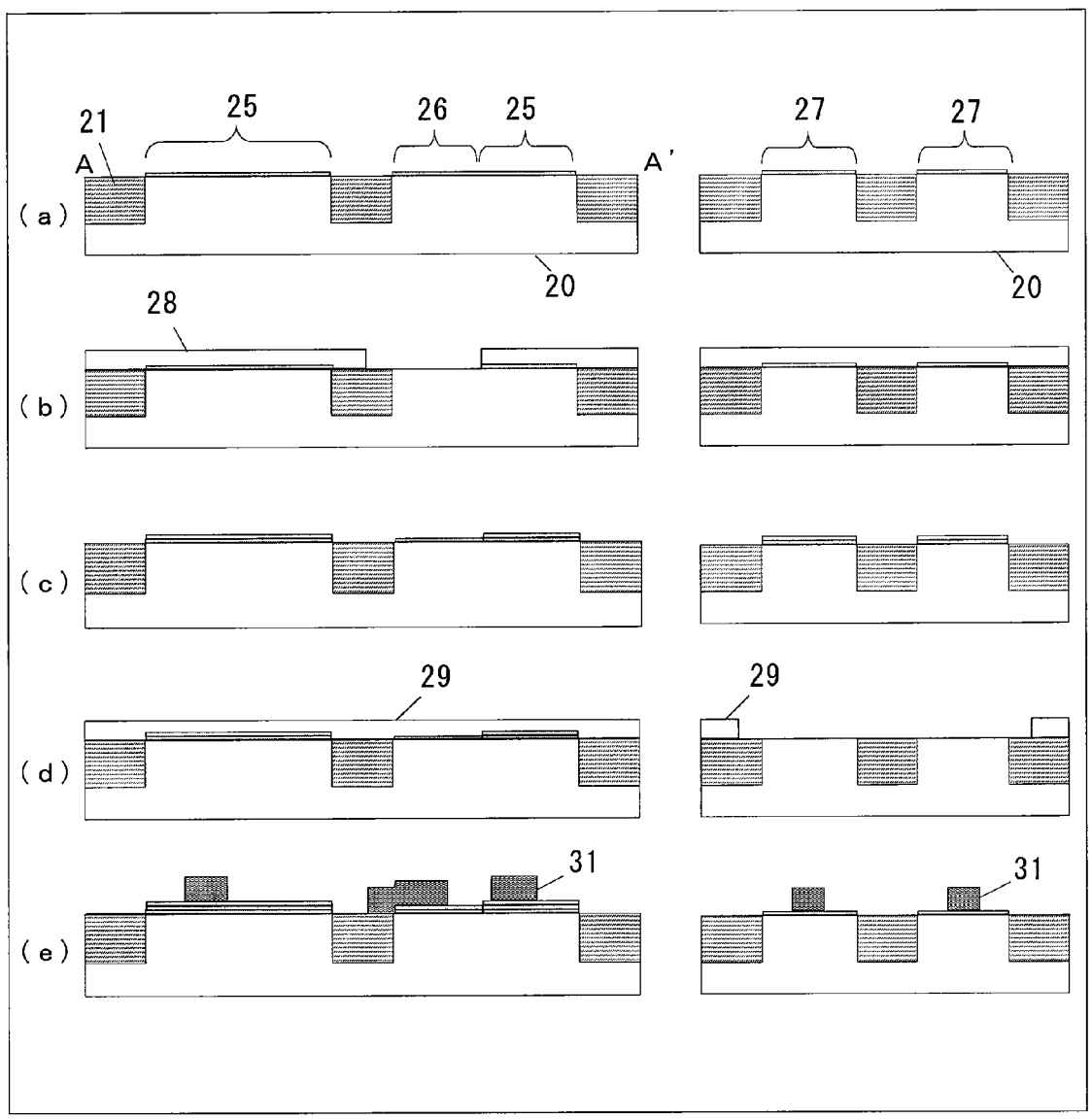
FIG. 6 is a diagram illustrating a process of manufacturing a gate insulation film for the solid-state imaging device according to the first embodiment of the present invention.

FIG. 6 is a cross-sectional view illustrating a process of manufacturing the above first to third gate insulation films 22 to 24 in the solid-state imaging device according to the first embodiment. In FIG. 6, cross-sectional structures of the pixel shown in (a) of FIG. 5, and cross-sectional structures of the micro transistors used in the peripheral circuit shown in (b) of FIG. 5 are shown in side by side. Note that any structure that is not related to description of a thermal oxidization process of the diffusion region and the like is omitted.

First, the element isolation region 21 is formed in the Si substrate 20, and then a gate insulation film is formed on the active region defined by the element isolation region 21 through first thermal oxidization using an RTP (Rapid Thermal Process) or the like ((a) of FIG. 6). Then, a photoresist 28 is formed through a photolithography process to open a second gate insulation film region 26 ((b) of FIG. 6). Wet etching is performed by using a diluted hydrofluoric acid solution to remove the thermal oxide film in the second gate insulation film region 26. The opening potion of the photoresist 28 is shown as a photoresist opening region 30 in FIG. 4. The photoresist opening portion 30 is arranged so as to include a region where the second gate insulation film for the amplification transistor 14 is formed, and not to include regions of the gate insulation films for the row selection transistor 15, the reset transistor 13, and the readout transistor 12, and the region of the photodiode 11. With this arrangement, it is possible to remove only the thermal oxide film of the second gate insulation film region of the amplification transistor 14 by using the wet etching.

Next, the photoresist 28 is exfoliated, and second thermal oxidization is performed by using the RTP or the like ((c) of FIG. 6). Through a photolithography process, a photoresist 29 to open the third gate insulation film region 27 is formed ((d) of FIG. 6). In this state, the wet etching is performed with the use of the diluted hydrofluoric acid solution, and the thermal oxide film in the third gate insulation film region 27 is removed. Thereafter, the photoresist 29 is exfoliated, and third thermal oxidization is performed by using the RTP or the like ((e) of FIG. 6).

As a result, in the first gate insulation film region 25, an oxide film (insulation film) is formed through the first to third thermal oxidization, and in the second gate insulation film region 26, another oxide film (insulation film) is formed through the second and third thermal oxidization, and in the third gate insulation film region 27, still another oxide film (insulation film) is formed through the third thermal oxidization. Therefore, the thermal oxide film in the first gate insulation film region 25 is thicker than the thermal oxide film in the second gate insulation film region 26, and the thermal oxide film in the second gate insulation film region 26 is thicker than the thermal oxide film in the third gate insulation film region 27.

By controlling the above-described first to third thermal oxidization process conditions, i.e., oxygen concentration in gas used for the thermal oxidization, oxygen temperature, oxidization time, and the like, it is possible to control the thickness of the oxide film in each of the first to third gate insulation film regions 25 to 27 so as to obtain a desired thickness. Normally, after the third thermal oxidization, the surface of the thermal oxide film is nitrided through the RTP process or the like. This is because when the surface of the thermal oxide film is nitrided, it is possible to prevent a B atom from diffusing from boron-doped polysilicon to the Si substrate 20, the boron-doped polysilicon being a gate material of the p-type micro transistor 18.

Thereafter, polysilicon film is formed and processed into a desired shape through the photolithography process and the etching process, and a gate electrode 31 made of the polysilicon is formed ((e) of FIG. 6).

With the above-described processes, the first to third gate insulation film 22 to 24 having different thicknesses, respectively, are formed as the gate insulation films for the transistors. The first gate insulation film 22 for the readout transistor 12 in the pixel is the thickest, the second gate insulation film 23 for the amplification transistor 14 in the pixel is the second thickest, and the third gate insulation film 24 for each of the n-type micro transistor 17 and the p-type micro transistor 18 in the peripheral circuit outside the pixel region is the thinnest.

The first gate insulation film 22, which is the gate oxide film of the readout transistor 12, is set to a thickness of 7.5 nm to 9.5 nm, for example, and the second gate insulation film 23, which is the gate oxide film for the amplification transistor 14, is set to a thickness of 4.5 nm to 6.5 nm, for example. When each of the gate insulation films has the above-mentioned range of thickness, the VDD power of the pixel is driven with 3.3V, and a voltage of 3.5 to 4.5V can be applied to the readout transistor 12 when a signal charge of the photodiode 11 is transferred. If the thickness of the first gate insulation film 22 is increased, it is possible to apply a higher voltage to the readout transistor 12, and thus a large amount of signal charge without afterimages can be transferred from the photodiode 11.

The third gate insulation film 24, which is the gate oxide film of each of the n-type micro transistor 17 and the p-type micro transistor 18, is set to the thickness of 2.1 nm, for example. When the gate insulation film has such a thickness, a transistor having a gate length of 110 nm can be realized, and a voltage of 1.2V can be applied as the VDD. Accordingly, the transistors can be operated at a high speed by using the voltage of 1.2V and a low power voltage. In addition, with the use of micro transistors each having a short gate length and a small area, an area of the peripheral circuit block outside the pixel region can be downsized, which enhances cost down in chips.

In the configuration of the circuit blocks of the solid-state imaging device shown in FIG. 1, the transistors in the peripheral circuit other than the pixel region 8 are not necessarily composed of the n-type micro transistor 17 and the p-type micro transistor 18 which are driven by a low power voltage. For example, an input/output voltage for the I/O circuit 7 needs to be consistent with the input/output specification of a peripheral IC, and is 2.5V to 3.3V, generally. Therefore, the power voltage of 2.5V to 3.3V is applied to most parts of the I/O circuit 7, and thus used in such parts are the transistors each having the first gate insulation film 22 or the second gate insulation film 23, which are used in the pixel, instead of the micro transistors each having a thin gate insulation film.

As to circuits other than the I/O circuit 7 such as the column circuit 2 and the output amplifier circuit 5, and the like, which include analog circuits, a power voltage of about 3.3V is necessary for such a portion thereof that amplifies a pixel signal. For such a portion, the first gate insulation film 22 or the second gate insulation film 23 is used. Specifically, capacitors used in the column circuit 2 need to be handled carefully.

Figure 2:
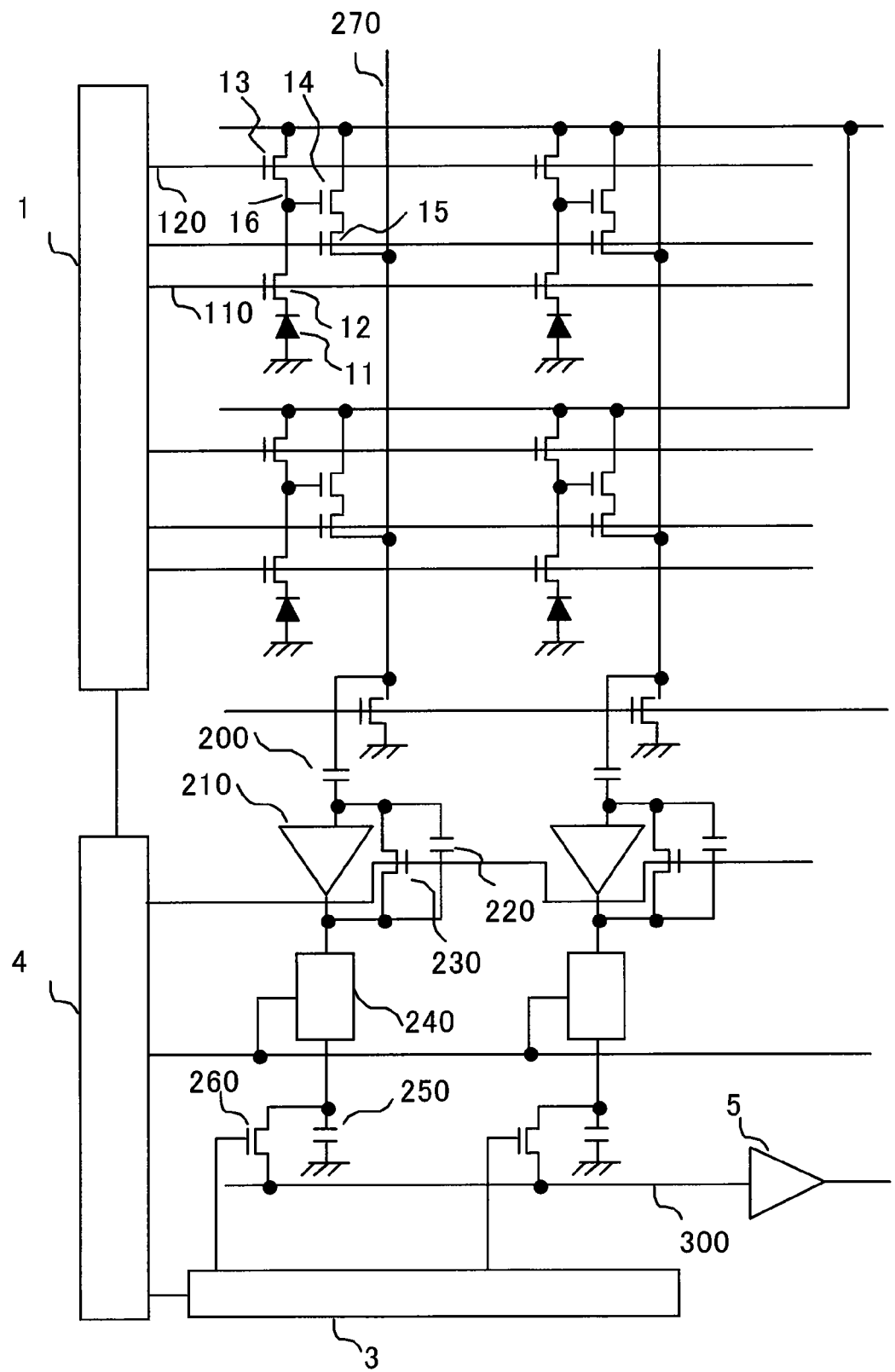
FIG. 2 is a diagram showing a circuit configuration that is common to the solid-state imaging device according to the first embodiment of the present invention, and the conventional solid-state imaging device.
Figure 3:
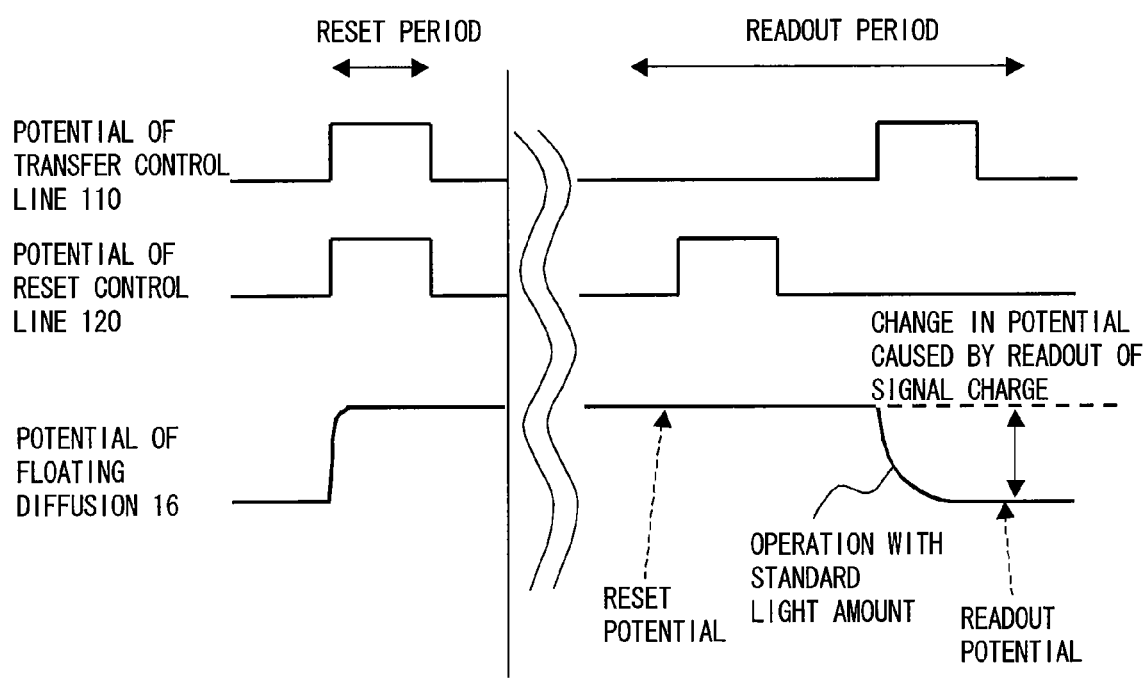
FIG. 3 is a diagram showing timing waveforms for illustrating driving of pixels shown in FIG. 2.

In FIG. 2, a signal from a pixel is amplified with the use of a clamp capacitor 200, a column amplifier 210, a column amplifier feedback capacitor 220, and a column amplifier reset transistor 230. When the pixel signal is amplified, a higher S/N ratio (ratio of the pixel signal to noise) can be obtained. Therefore, the column amplifier is an indispensable technology for a highly sensitive solid-state imaging device. Gain of the column amplifier circuit is obtained by dividing a capacitance value of the column amplifier feedback capacitor 220 by a capacitance value of the clamp capacitor 200. Therefore, amplification gain using the column amplifier fluctuates when the clamp capacitor 200 and the column amplifier feedback capacitor 220 fluctuate, and consequently a failure occurs to a vertical line image. Therefore, to prevent the fluctuation, the size of each of the clamp capacitor 200 and the sample capacitor 250 needs to be increased.

Further, the pixel signal amplified by the column amplifier 210 undergoes noise cancellation in a column CDS circuit 240 (indicated by a block, and details thereof being omitted). That is, the column CDS circuit 240 is a circuit to cancel fluctuation of an offset voltage generated in the column amplifier 210, and a MOS capacitor is used in the column CDS circuit 240. Since fluctuation in the MOS capacitor also affects accuracy of the noise cancellation, it is preferable to increase the size of the MOS capacitor.

Further, a signal having undergone the noise cancellation in the column CDS circuit 240 is accumulated in the sample capacitor 250, and then sent to the output amplifier circuit 5 through a column selection transistor 260, and a horizontal common signal line 300. When a charge accumulated in the sample capacitor 250 is sent to the output amplifier circuit 5, the voltage of the charge is lowered, since the voltage is shared with a parasitic capacitor of the horizontal common signal line 300. Therefore, when the size of the sample capacitor 250 is larger, a larger amount of charge is accumulated in the sample capacitor 250, and thus it is possible to prevent lowering of the voltage at the time of sending the charge to the output amplifier circuit 5. Accordingly, the charge is hardly affected by noises occurring thereafter, such as a noise generated in the output amplifier circuit 5, for example. That is, it is preferable to increase the size of the sample capacitor 250.

As above described, the clamp capacitor 200, the column amplifier feedback capacitor 220, the capacitor in the column CDS circuit 240, and the sample capacitor 250 are each formed by the MOS capacitor, and a large amount of MOS capacitor is necessary to suppress the noise occuring in the column circuit 2. The MOS capacitor in the column circuit 2 largely affects the chip size, and thus it is preferable that the gate insulation film for the MOS capacitor is formed as thin as possible and the size of the MOS capacitor is also formed small.

Since the MOS capacitor is included in an analog circuit to amplify an image signal, it is impossible to use the thick third gate insulation film 24, and thus the first gate insulation film 22 or the second gate insulation film 23 is to be used. Specifically, in order to decrease the size of the MOS capacitor, it is preferable to use the second gate insulation film 23. In this manner, the second gate insulation film used for the amplification transistor 14 is also used for the MOS capacitor used in the analog circuit, whereby a decrease in the chip size is enhanced.

Second Embodiment

Figure 7:
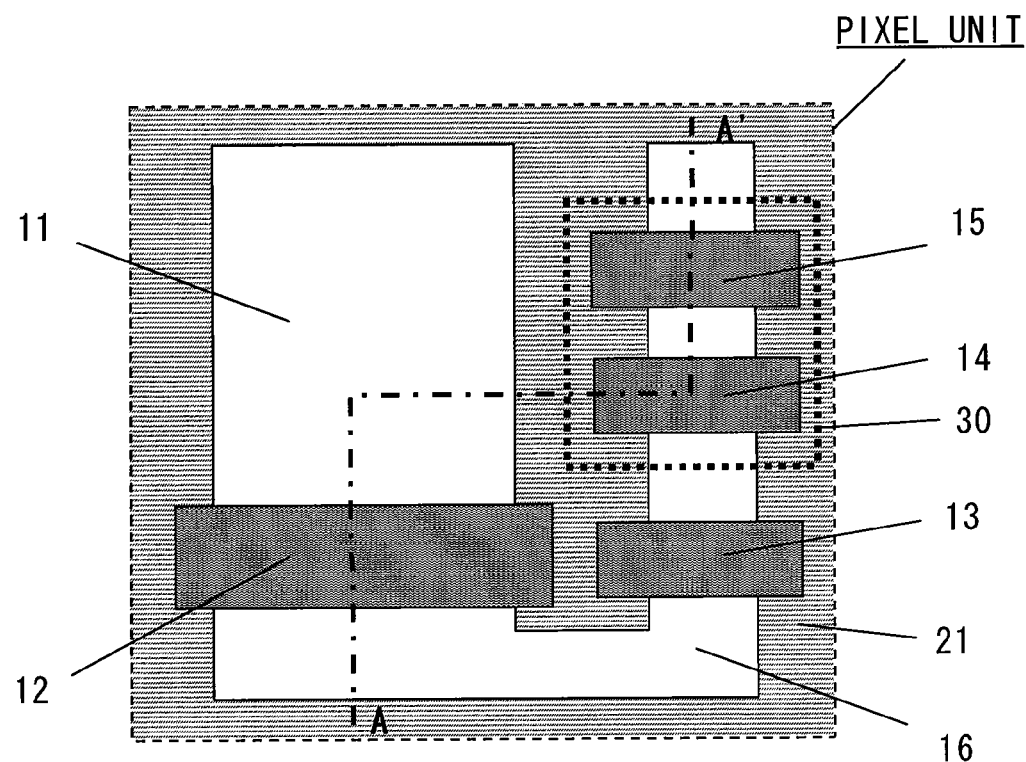
FIG. 7 is a diagram showing a schematic layout of a unit pixel of a solid-state imaging device according to a second embodiment of the present invention.
Figure 7:
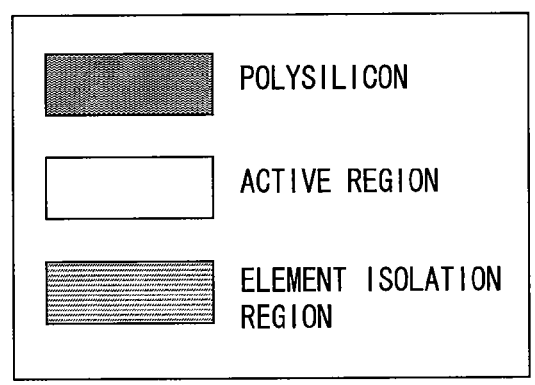

FIG. 7 is a plan view showing a schematic layout of a unit pixel in the solid-state imaging device according to a second embodiment. The layout of the solid-state imaging device according to the second embodiment is substantially the same as that of the solid-state imaging device according to the first embodiment. However, in the second embodiment, the photoresist opening region 30 covers the active region composed of the amplification transistor 14 and the row selection transistor 15, which is different from the first embodiment.

In addition to the amplification transistor 14, the row selection transistor 15 uses the second gate insulation film 22 as the gate oxide film thereof. The row selection transistor 15 and the amplification transistor 14 are aligned in series in the circuit, and the source of the amplification transistor 14 and the drain of the row selection transistor 15 are formed by a common n-type diffusion region, and there is no contact between the source and the drain. For the sake of micronization of pixels, it is advantageous to minimize a distance between the amplification transistor 14 and the gate electrode adjoining to the row selection transistor 15

In this manner, under a condition where the distance between the amplification transistor 14 and the gate electrode adjoining to the row selection transistor 15 is small, when the second gate insulation film is used as the gate insulation film for the amplification transistor 14 only, as shown in the first embodiment, problems may be cases in terms of processing such as alignment margin in the photolithography process and reproducibility of the photoresist opening region 30. Therefore, in the second embodiment, the row selection transistor 15 has the second gate insulation film applied thereto as the gate oxide film, in the same manner as the amplification transistor 14, whereby a similar effect can be obtained.

However, since the thickness of the gate insulation film for the row selection transistor 15 is thinner, the maximum voltage applicable to the row selection transistor 15 decreases, which may cause restriction in pixel operation. For example, there may be a case where the gate voltage of the row selection transistor 15 needs to be set lower than that of the reset transistor 13 and the readout transistor 12.

Third Embodiment

Figure 8:
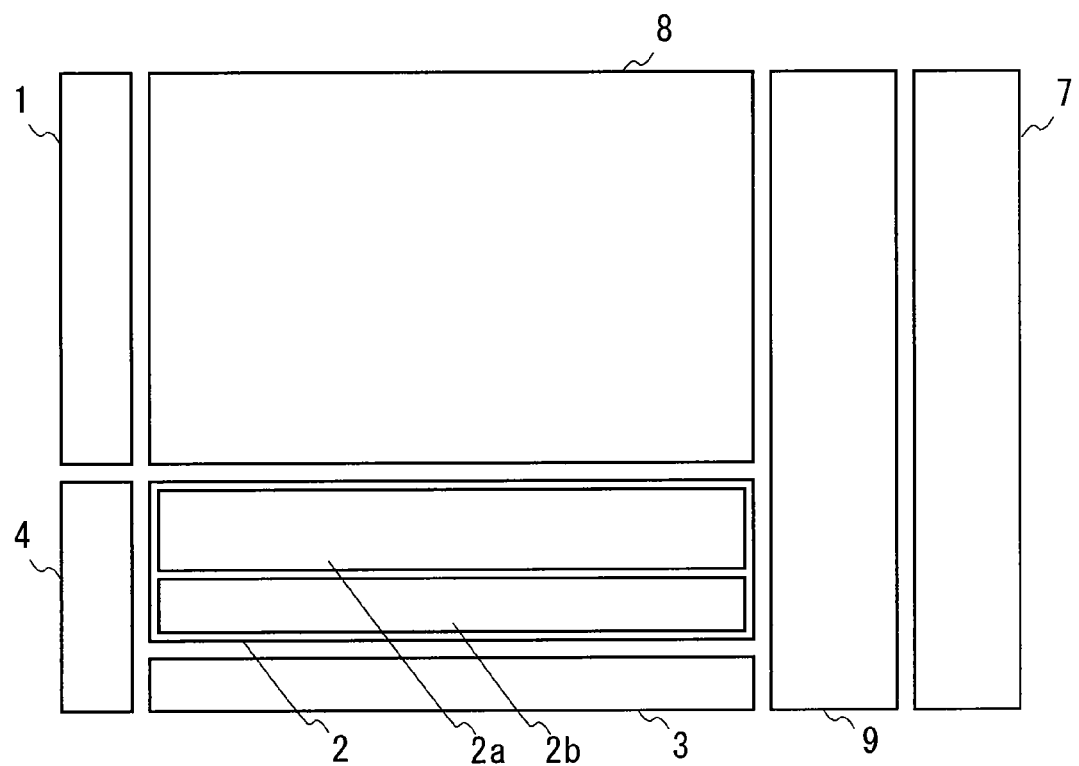
FIG. 8 is a diagram showing a layout configuration of a solid-state imaging device according to a third embodiment of the present invention.

FIG. 8 is a plan view showing a layout configuration of a solid-state imaging device according to a third embodiment of the present invention. The solid-state imaging device according to the third embodiment includes an AD conversion circuit and a signal processing circuit as the peripheral circuit outside the pixel region 8. Accordingly, the total size of the peripheral circuit is increased in the third embodiment.

A column AD conversion circuit 2a to perform AD conversion of a pixel signal and a digital memory circuit 2b to store a result of the AD conversion are arranged in parallel with the column circuit 2. A signal processing circuit 9 to process the AD converted pixel signal is also arranged. Each of the column AD conversion circuit 2a and the digital memory circuit 2b includes the n-type micro transistor 17 and the p-type micro transistor 18 having the third gate insulation film 24 arranged therefor. With the use of the micro transistors, a decrease in a block area is enhanced in each of the circuits. Further, with the use of the micro transistors, it is possible to use a lower power voltage (e.g., 1.2V), in the same manner as first embodiment, and to perform high-speed processing.

Due to the high-speed processing, enhanced functions such as a high frame rate and the like can be realized. In the third embodiment, in the same manner as the first embodiment, the first gate insulation film is used for the readout transistor 12, and the second gate insulation film is used for the amplification transistor 14, in a pixel. Accordingly, a 1/f noise of the amplification transistor 14 can be reduced, and high saturated signal charge amount can be realized.

As above described, according to the solid-state imaging device according to each of the embodiments of the present invention, the first to third gate insulation film 22 to 24 are used for the readout transistor 12 in a pixel, the amplification transistor 14 in the pixel, and the n-type micro transistor 17 and the p-type micro transistor 18 in the peripheral circuit outside the pixel, respectively, the thicknesses of the respective gate insulation films are decreased in this order. Accordingly, it is possible to suppress the 1/f noise of the amplification transistor 14. Further, by increasing the saturated charge amount, it is possible to raise the S/N ratio, and also possible to use micro transistors in the circuits outside the pixel region. Still further, it is possible to realize cost down resulting from the decrease in the chip size, low power consumption resulting from driving with the low voltage, and enhanced functions such as the high frame rate resulting from the high-speed operation.

The present invention is applicable to image apparatuses such as a mobile phone, a digital still camera, a movie camera, and the like, and also applicable to a case where a large amount of pixel information needs to be processed at a high-speed.

While the invention has been described in detail, the foregoing description is in all aspects illustrative and not restrictive. It is understood that numerous other modifications and variations can be devised without departing from the scope of the invention.

What is claimed is:

1. A MOS type solid-state imaging device including a pixel region having pixels arranged on a matrix, and a peripheral circuit driving the pixels and obtaining output signals, wherein
the pixel region comprises:
at least one photodiode;
a readout transistor for reading a charge accumulated in the photodiode;
a floating diffusion composed of an impurity diffusion layer, for converting the read charge into a voltage;
a reset transistor for resetting the converted voltage at the floating diffusion to a predetermined voltage; and
an amplification transistor for receiving a potential of the floating diffusion as a gate input,
a first gate insulation film used for the readout transistor in the pixel is thicker than a second gate insulation film used for the amplification transistor in the pixel, and
the second gate insulation film used for the amplification transistor is thicker than a third gate insulation film used for at least one of transistors in the peripheral circuit.

2. The solid-state imaging device according to claim 1, wherein either of the first gate insulation film and the second gate insulation film is used for a transistor in analog circuits in the peripheral circuit.

3. The solid-state imaging device according to claim 2, wherein either of the first gate insulation film and the second gate insulation film is used for transistors in a column amplifier section of the analog circuits.

4. The solid-state imaging device according to claim 3, wherein either of the first gate insulation film and the second gate insulation film is used for a MOS capacitor arranged in a column circuit of the analog circuits.

5. The solid-state imaging device according to claim 1, wherein either of the first gate insulation film and the second gate insulation film is used for a transistor in an I/O circuit in the peripheral circuit.

6. The solid-state imaging device according to claim 1, wherein
in each pixel, a row selection transistor is arranged so as to be in series with the amplification transistor, and
the second gate insulation film is used for each of the amplification transistor and the row selection transistor.

* * * * *